United States Patent
Kwon et al.

(10) Patent No.: US 8,400,057 B2
(45) Date of Patent: Mar. 19, 2013

(54) SEALING SUBSTRATE, ORGANIC ELECTROLUMINESCENCE APPARATUS AND METHOD OF FABRICATING THE SAME

(75) Inventors: Oh-Seob Kwon, Yongin (KR); Dong-Seop Park, Yongin (KR); Jung-Jun Im, Yongin (KR); Jae-Sang Ro, Yongin (KR); Won-Eui Hong, Yongin (KR); Seog-Young Lee, Yongin (KR)

(73) Assignees: Samsung Display Co., Ltd., Giheung-Gu, Yongin, Gydonggi-Do (KR); EnsilTech Corporation, Seoul (KR)

(*) Notice: Subject to any disclaimer, the term of this patent is extended or adjusted under 35 U.S.C. 154(b) by 0 days.

(21) Appl. No.: 12/949,445

(22) Filed: Nov. 18, 2010

(65) Prior Publication Data
US 2011/0115370 A1    May 19, 2011

(30) Foreign Application Priority Data
Nov. 18, 2009    (KR) .................. 10-2009-0111670

(51) Int. Cl.
*H01J 1/62* (2006.01)
*H01J 9/26* (2006.01)
*H05K 1/00* (2006.01)
*H05K 1/09* (2006.01)

(52) U.S. Cl. ............ 313/512; 313/507; 445/24; 445/25; 257/70

(58) Field of Classification Search .......... 257/72, 257/40; 313/512; 315/169.1, 169.3
See application file for complete search history.

(56) References Cited

U.S. PATENT DOCUMENTS
2007/0096631 A1*  5/2007  Sung et al. .......... 313/498

FOREIGN PATENT DOCUMENTS
JP    2000143262        5/2000
KR    20030080895 A    10/2003
WO    2009108321 A1    9/2009

OTHER PUBLICATIONS

Korean Notice of Allowance issued on Oct. 31, 2011 in connection with Korean Patent Application Serial No. 10-2009-0111670 and Request for Entry of the Accompanying Office Action attached herewith.

Korean Office Action issued by Korean Industrial Property Office on May 11, 2011, corresponding to Korean Patent Application No. 10-2009-0111670 and Request for Entry of the Accompanying Office Action attached herewith.

* cited by examiner

*Primary Examiner* — Tracie Y Green
(74) *Attorney, Agent, or Firm* — Robert E. Bushnell, Esq.

(57) ABSTRACT

An organic electroluminescence apparatus comprises: a substrate having a pixel region and sealing regions; an organic electroluminescence device located in the pixel region of the substrate; and a sealing substrate having a pixel region and sealing regions corresponding to the pixel region and the sealing regions of the substrate. The sealing regions of the sealing substrate comprise conductive layers continuously connected to each other. In a method of manufacturing organic electroluminescence apparatus by sealing the substrate and the sealing substrate using a glass frit, manufacturing costs and process time can be greatly reduced.

25 Claims, 5 Drawing Sheets

SEALING SUBSTRATE, ORGANIC ELECTROLUMINESCENCE APPARATUS AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on the 18 Nov. 2009 and there duly assigned Serial No. 10-2009-0111670.

BACKGROUND OF THE INVENTION

1. Field of the Invention

The present invention relates to a sealing substrate, an organic electroluminescence apparatus, and a method of fabricating the same, and more particularly, to a sealing substrate which is formed by performing a sealing process using a glass frit, an organic electroluminescence apparatus, and a method of fabricating the same.

2. Description of the Related Art

Recently, flat panel display apparatuses, such as liquid crystal display devices, organic electroluminescence apparatuses, or plasma display panels (PDPs) which solve the drawback of conventional display devices such as the cathode ray tube, have received considerable attention.

A liquid crystal display device has limitations in brightness, contrast, viewing angle, and enlarging area since the liquid crystal display device is not an emissive display but rather a passive display. A PDP is an emissive display device, but it is heavier than other flat panel display apparatuses, it has high power consumption, and it has a complicated manufacturing process.

However, an organic electroluminescence apparatus has advantages in terms of viewing angle and contrast since the organic electroluminescence apparatus is an emissive display device. In terms of manufacturing a light-weight and thin display device, and in terms of power consumption, it does not require a backlight. Also, the organic electroluminescence apparatus is advantageous in that it is operable at a direct current low voltage, has a short response time, has high resistance to external impact since it is made of all solid parts, has a wide operating temperature range, and can be manufactured in a simple process and low costs.

SUMMARY OF THE INVENTION

To address the above and/or other problems, the present invention provides a new method of melting a glass frit so as to seal a substrate, and a sealing substrate using the glass frit.

According to an aspect of the present invention, a sealing substrate includes a pixel region and sealing regions, wherein the sealing region includes conductive layers continuously connected to each other.

According to an aspect of the present invention, an organic electroluminescence apparatus comprises: a substrate having a pixel region and sealing regions; an organic electroluminescence device located on the pixel region of the substrate; and a sealing substrate having a pixel region and sealing regions corresponding to the pixel region and the sealing regions of the substrate; wherein the sealing regions of the sealing substrate include conductive layers continuously connected to each other.

The sealing substrate may further include electric field application regions formed in outer regions of the sealing regions, and third conductive layers which are formed on the electric field application regions and extend in a straight line from the first conductive layers.

The sealing substrate may further include glass frits formed on the conductive layers.

According to another aspect of the present invention, a method of manufacturing an organic electroluminescence apparatus comprises: providing a substrate having a pixel region and sealing regions; forming an organic electroluminescence device on the pixel region of the substrate; providing a sealing substrate having a pixel region and sealing regions corresponding to the pixel region and the sealing regions of the substrate; and combining the substrate and the sealing substrate; wherein the sealing regions of the sealing substrate include conductive layers continuously connected to each other and glass frits formed on the conductive layers.

The sealing substrate may further include electric field application regions formed in outer regions of the sealing regions and third conductive layers which are formed on the electric field application regions, and which extend in a straight line from the first conductive layers.

The method may further include the step of sealing by bonding the sealing substrate to the substrate after the sealing substrate and the substrate are combined with each other, and the step of sealing by bonding the sealing substrate to the substrate includes melting the glass frits by applying an electric field onto the conductive layers.

The method may further include the step of sealing by bonding the sealing substrate to the substrate after combining the sealing substrate with the substrate, and the step of sealing by bonding the sealing substrate to the substrate includes melting the glass frits by applying an electric field onto the third conductive layers.

The third conductive layers may include an upper third conductive layer and a lower third conductive layer, and an electric field may be applied in a sequence to the upper third conductive layer and the lower third conductive layer.

The third conductive layers may include an upper third conductive layer and a lower third conductive layer, and an electric field may be applied in parallel to the upper third conductive layer and the lower third conductive layer.

In the organic electroluminescence apparatus according to the present invention, in order to seal a substrate and a sealing substrate, glass frits formed on or under the conductive layers are melted by applying a joule heat to the conductive layers, and thus the manufacturing costs and process time can be greatly reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to one skilled in the art. In the drawings, the thicknesses of layers and regions are exaggerated for clarity. It will also be understood that, when a layer is referred to as being "on" another layer or substrate, it can be directly on the other layer or substrate, or intervening layers may also be present. Like reference numerals in the drawings denote like elements.

Figure 1:
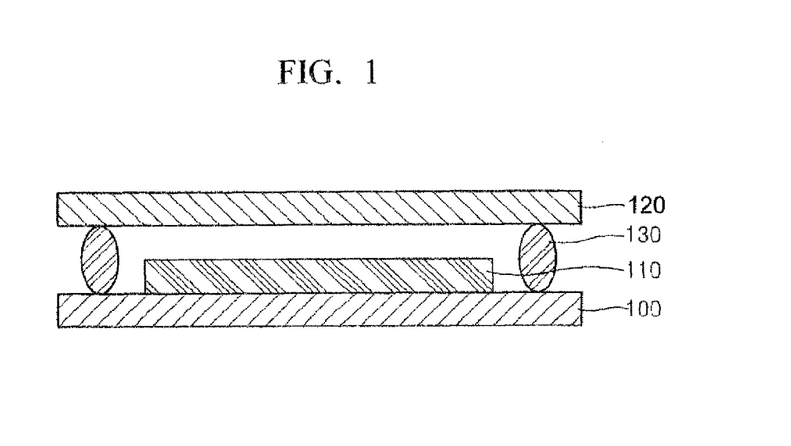
FIG. 1 is a cross-sectional view of an organic electroluminescence apparatus.

FIG. 1 is a cross-sectional view of an organic electroluminescence device.

Referring to FIG. 1, a substrate 100 is provided and the organic electroluminescence device 110 is formed on the substrate 100. The organic electroluminescence device 110 includes a first electrode, an organic film layer which includes at least a light emitting layer, and a second electrode.

The organic electroluminescence device 110 may further include a semiconductor layer, a gate electrode, and a thin film transistor which includes a source/drain electrode.

A sealing substrate 120 is also provided, and glass frits 130 are formed on a surface of the substrate 100 or the sealing substrate 120 so that the substrate 100 and the sealing substrate 120 are combined with or joined to each other.

Subsequently, a laser is irradiated onto the glass frits 130 so as to melt the glass frits 130, and thus the organic electroluminescence device 110 is formed by solidifying the glass frits 130.

However, the fusion of the glass frits 130 by irradiating a laser by means of a laser radiation apparatus is the cause of a cost push since the laser radiation apparatus is an expensive piece of equipment.

Also, in irradiating a laser to melt the glass frits 130, since the laser must be irradiated onto regions corresponding to locations where the glass frits 130 are positioned, a precise alignment is required, and thus a long process time takes place since the laser irradiation must be performed on each of the regions.

Figure 2A:
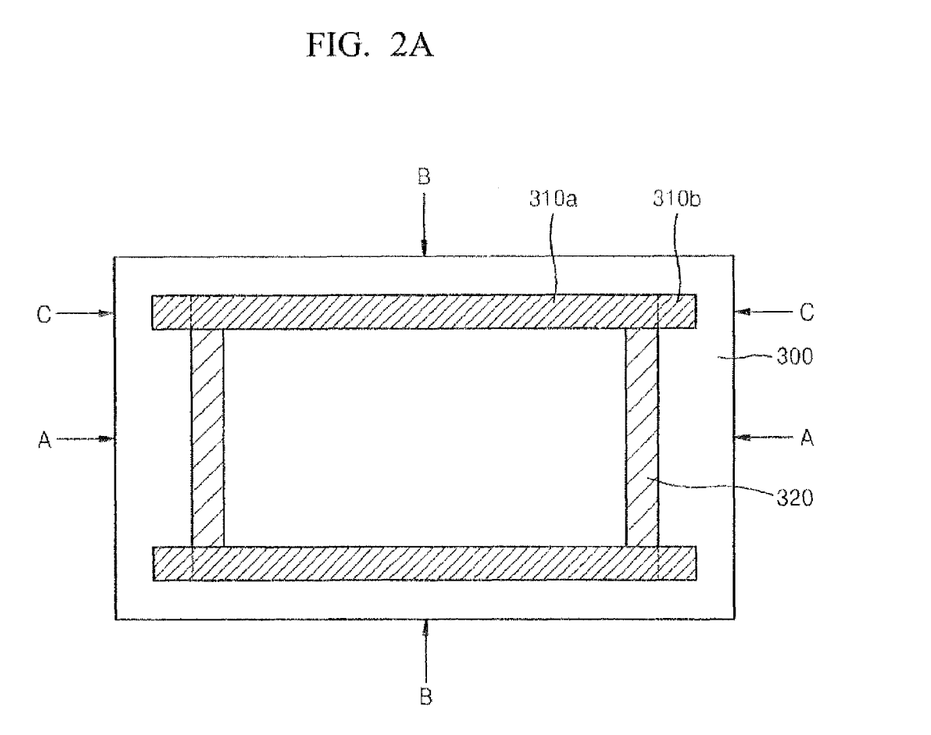
FIG. 2A is a plan view of a sealing substrate according to an embodiment of the present invention.
Figure 2B:
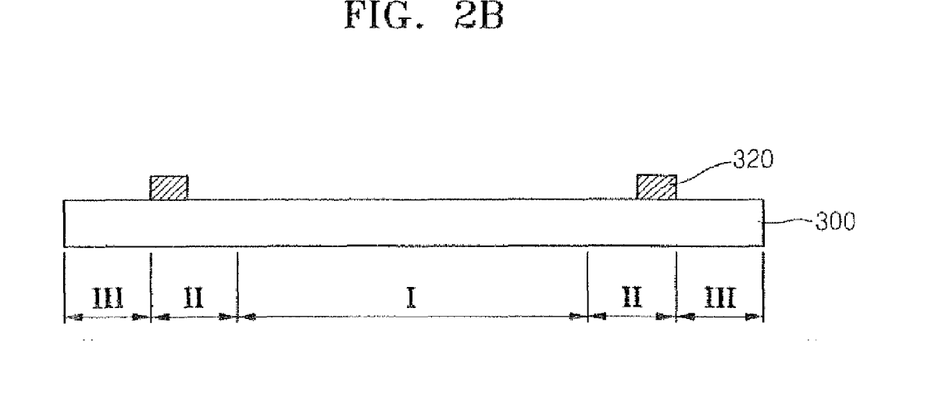
FIG. 2B is a cross-sectional view taken along the line A-A of FIG. 2A.
Figure 2C:
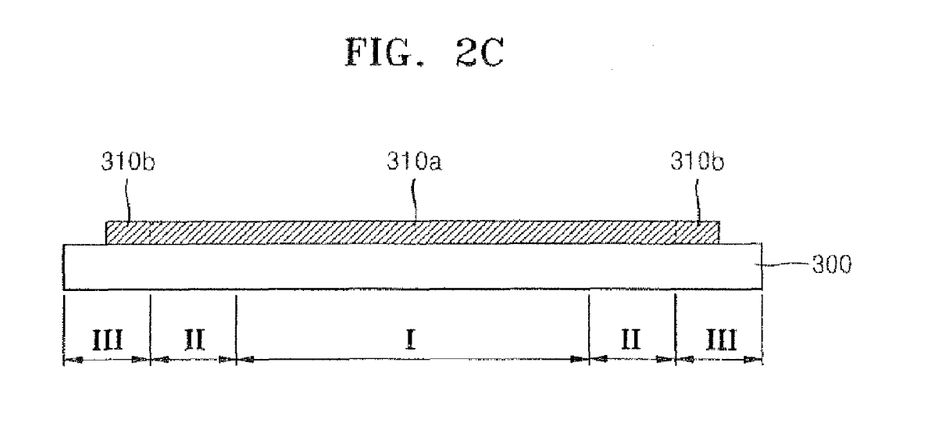
FIG. 2C is a cross-sectional view taken along the line B-B of FIG. 2A.
Figure 2D:
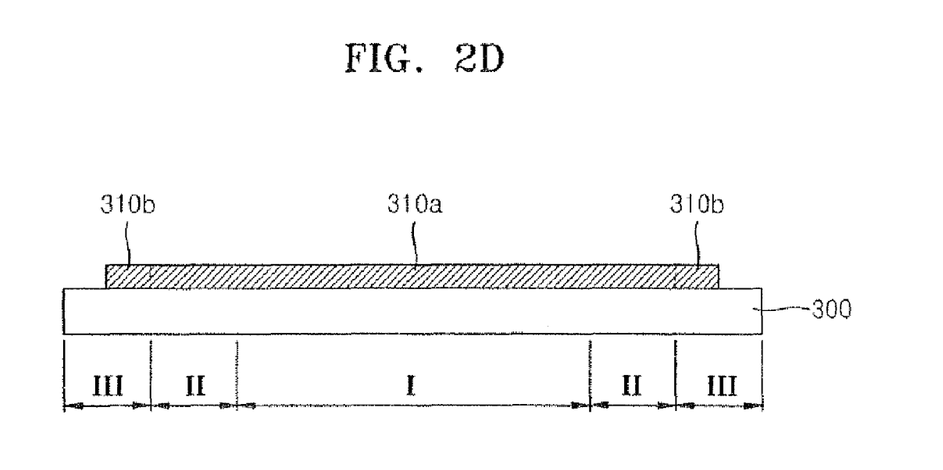
FIG. 2D is a cross-sectional view taken along the line C-C of FIG. 2A.

FIG. 2A is a plan view of a sealing substrate according to an embodiment of the present invention, FIG. 2B is a cross-sectional view taken along the line A-A of FIG. 2A, FIG. 2C is a cross-sectional view taken along the line B-B of FIG. 2A, and FIG. 2D is a cross-sectional view taken along the line C-C of FIG. 2A.

Referring to FIGS. 2A thru 2D, the sealing substrate 300 according to an embodiment of the present invention includes a pixel region I, sealing regions II, and electric field application regions III. At this point, the pixel region I corresponds to a pixel region I of a device substrate which will be described later, and the sealing regions II correspond to sealing regions II of the device substrate. Also, the electric field application regions III are regions where third conductive layers are formed for applying an electric field to conductive layers which will be described later.

Also, referring to FIGS. 2A thru 2D, in the sealing substrate 300, first conductive layers 310a and second conductive layers 320 are formed on the sealing regions II. Third conductive layers 310b extending from the first conductive layers 310a are formed in the electric field application regions III. At this point, the first conductive layer 310a may be formed, for example, in a horizontal direction, and the second conductive layers 320 may be formed, for example, in a vertical direction.

That is, as shown in FIG. 2A, the first conductive layers 310a and the second conductive layers 320 define the sealing regions II by being continuously connected to each other, and the third conductive layers 310b are formed in the electric field application regions III, which are outer regions of the sealing regions II by extending in a straight line from the first conductive layers 310a.

The first conductive layers 310a, the second conductive layers 320, and the third conductive layers 310b may be formed of a transparent conductive thin film of a metal thin film, and more specifically, the transparent conductive thin film may be formed of indium tin oxide (ITO) or indium zinc oxide (IZO), and the metal thin film may be formed of Mo, Ti, Cr, Al, Cu, Au, Ag, Pd, or MoW. However, the material for forming the conductive layers according to the present invention is not limited to the materials described above.

The first conductive layers 310a, the second conductive layers 320, the third conductive layers 310b may be formed to a thickness in a range of 500 to 3000 Å by using a sputtering method or an evaporation method. However, the method and thickness of the conductive layers according to the present invention are not limited thereto.

At this point, the first conductive layers 310a and the third conductive layers 310b may have a low resistance of a few ohms, and the second conductive layers 320 may have a high resistance of a few tens to hundreds of ohms, which will be described later.

Figure 3:
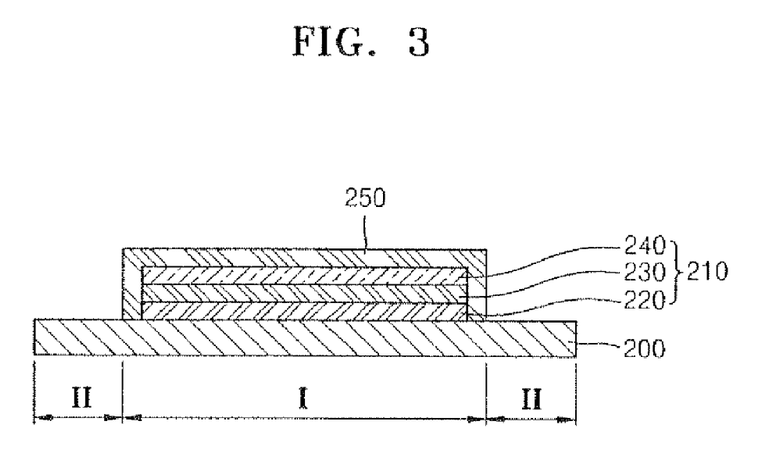
FIG. 3 is a cross-sectional view of a substrate having an organic electroluminescence device according to an embodiment of the present invention.

FIG. 3 is a cross-sectional view of a substrate having an organic electroluminescence device according to an embodiment of the present invention.

Referring to FIG. 3, the substrate 200 having the organic electroluminescence device 210 includes a pixel region I and sealing regions II. The substrate 200 may be an insulating glass substrate, a plastic substrate, or a conductive substrate.

The organic electroluminescence device 210 is formed on the pixel region I of the substrate 200. The organic electroluminescence device 210 includes a first electrode 220, an organic film layer 230 which includes at least a light emitting layer, and a second electrode 240.

The first electrode 220 of the organic electroluminescence device 210 may be formed of ITO or IZO. Also, if the organic electroluminescence device 210 is a top emission type, the organic electroluminescence device 210 may further include a reflection film.

The organic film layer 230 includes at least a light emitting layer, and may additionally include at least one of a hole injection layer (HIL), a hole transport layer (HTL), an electron transport layer (ETL), or an electron injection layer (EIL).

The second electrode 240 may be formed of a material having a low work function such as Mg, Ag, Al, or Ca, or at least an alloy of these metals.

Also, although not shown, the organic electroluminescence device 210 may further include a semiconductor layer, a gate electrode, and a thin film transistor having a source/drain electrode.

The thin film transistor may form a top gate structure in which the gate electrode is formed on the semiconductor layer, and alternatively, the thin film transistor may form a bottom gate structure in which the gate electrode is formed under the semiconductor layer.

However, the type of the organic electroluminescence device 210 according to the present invention is not limited to the above structure.

Next, a passivation film 250 covering the organic electroluminescence device 210 may be formed. The passivation film 250 prevents the organic electroluminescence device 210 from external physical and chemical stimulations, and may be formed as an organic film, an inorganic film, or a composite of these films.

Figure 4:
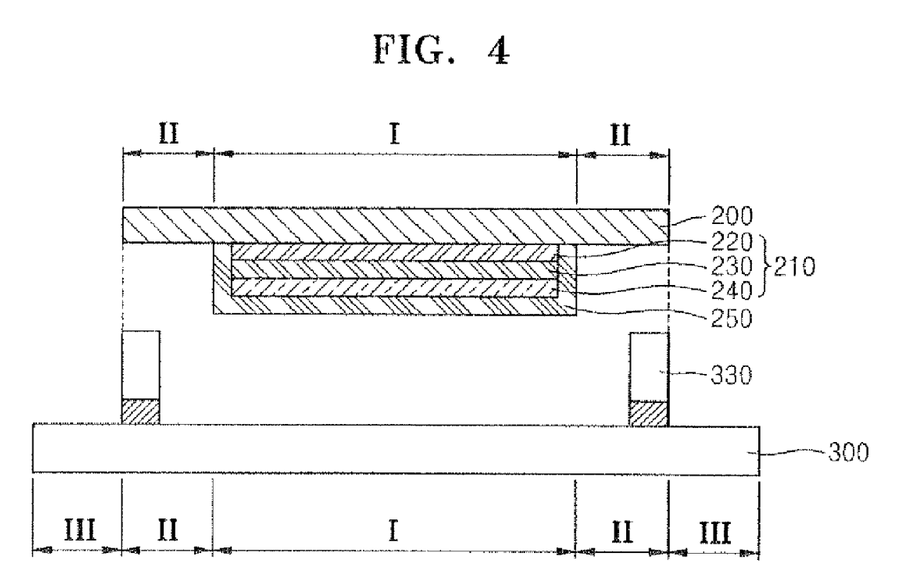
FIG. 4 is a cross-sectional view of a substrate having an organic electroluminescence device before combining with a sealing substrate according to an embodiment of the present invention.

FIG. 4 is a cross-sectional view of a substrate having an organic electroluminescence device before combining with a sealing substrate according to an embodiment of the present invention.

Referring to FIG. 4, the sealing substrate 300 and the substrate 200 having an organic electroluminescence device are disposed so as to face each other. That is, a pixel region I and sealing regions II of the substrate 200 are respectively disposed so as to face a pixel region I and sealing regions II of the sealing substrate 300.

At this point, as described above, the sealing regions II of the sealing substrate 300 include the first conductive layers 310a and the second conductive layers 320 of FIGS. 2A thru 2D. That is, the first conductive layers 310a and the second conductive layers 320 may define the sealing regions II by being continuously connected to each other.

Glass frits 330 (FIG. 4) for sealing the substrate 200 and the sealing substrate 300 are formed on the first conductive layer 310a and the second conductive layer 320 (FIGS. 2A thru 2D).

The glass frit 330 may be formed of PbO, $B_2O_8$, or $SiO_2$ by using a screen printing method or a dispensing method. However, the material and method for forming the glass frit 330 are not limited thereto.

In FIG. 4, the glass frits 330 are formed on the first conductive layer 310a and the second conductive layer 320 (FIGS. 2A thru 2D). However, unlike in the drawing, the glass frit 330 may be formed on regions of the substrate 200 corresponding to the first conductive layer 310a and the second conductive layer 320.

That is, when the glass frits 330 are formed on the sealing substrate 300, the glass frits 330 may be formed on the first conductive layer 310a and the second conductive layer 320, and when the glass frits 330 are formed on the substrate 200, the glass frits 330 are formed on the regions corresponding to the first conductive layer 310a and the second conductive layer 320.

Figure 5A:
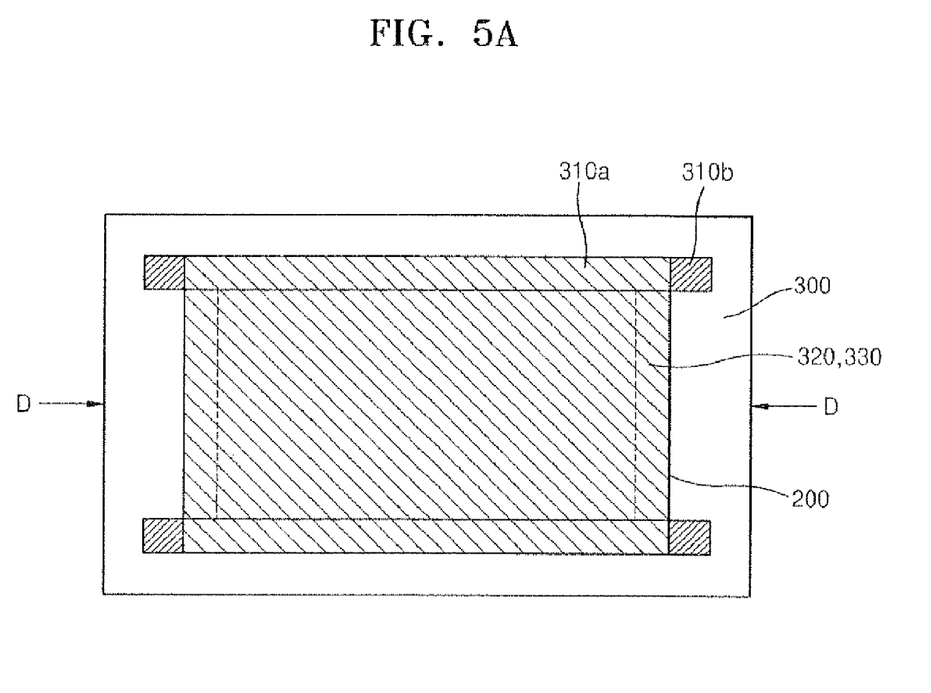
FIG. 5A is a plan view of a substrate having an organic electroluminescence device after combining with a sealing substrate according to an embodiment of the present invention.
Figure 5B:
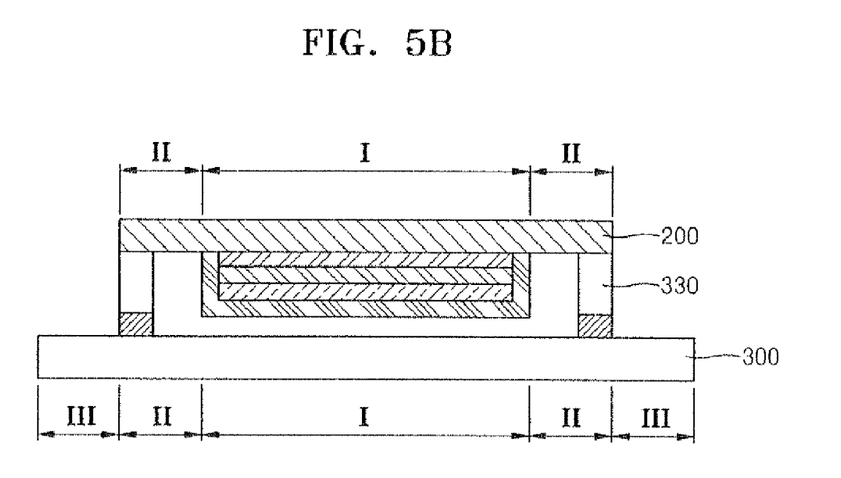
FIG. 5B is a cross-sectional view taken along the line D-D of FIG. 5A.

FIG. 5A is a plan view of a substrate having an organic electroluminescence device after combining with a sealing substrate according to an embodiment of the present invention, and FIG. 5B is a cross-sectional view taken along the line D-D of FIG. 5A.

Referring to FIGS. 5A and 5B, the sealing substrate 300 and the substrate 200 are disposed so as to face each other and are combined by applying a pressure.

At this point, referring to FIG. 5A, the third conductive layers 310b formed on the electric field application regions III of the sealing substrate 300 are exposed to the outside.

That is, since the third conductive layers 310b are formed on the electric field application regions III, which are outer regions of the sealing regions II, by extending in a straight line from the first conductive layers 310a, the third conductive layers 310b may be exposed to the outside, although the substrate 200 and the sealing substrate 300 are combined with each other.

Next, a joule heat is generated by applying an electric field onto the third conductive layers 310b so as to melt and solidify the glass frit 330, and thus the combination of the substrate 200 and the sealing substrate 300 is completed.

In this way, an organic electroluminescence apparatus according to the present invention may be formed.

A process of melting the glass frit 330 by applying an electric field onto the conductive layers will now be described.

The application of an electric field with respect to the conductive layers is performed by applying an energy having a power density which can generate heat greater than a temperature at which the glass frit 330 can melt by joule heating.

As described above, in the present invention, a joule heat is generated by applying an electric field onto the conductive layers. Here, joule heating denotes heating using heat generated due to the resistance of a conductive wire when a current flows through the conductive wire.

That is, the amount of energy per hour applied to the conductive layers by joule heating due to the application of an electric field onto the conductive layers can be expressed by the following equation.

$$W = V \times I$$

In the above equation, W is amount of energy per hour by joule heating, V is a voltage applied to both ends of the conductive layers, and I is current.

From the above equation, it is seen that the amount of energy per hour applied to the conductive layers by joule heating increases as the voltage increases and/or as the current becomes greater. When the temperature of the conductive layers increases by joule heating, the glass frit 330 located on or under the conductive layers melts.

At this point, the application of an electric field cannot be specifically defined since the electric field must be determined according to various factors such as resistance, vertical orientation and/or thickness of the conductive layers. However, the electric field may have a power density in a range of approximately 100 to 1,000,000 W/cm$^2$. Also, the current may be a direct current or an alternating current, and the application time of the electric field may be 1/10,000,000~10 seconds for continuous application. The application of an electric field can be regularly or irregularly repeated a few times.

Figure 6A:
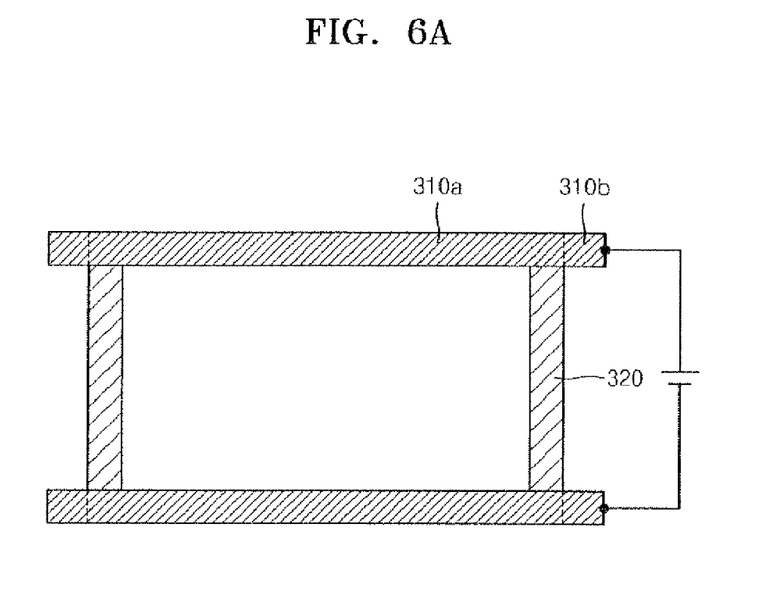
FIGS. 6A and 6B are plan views for explaining the application of an electric field to a conductive layer according to an embodiment of the present invention.
Figure 6B:
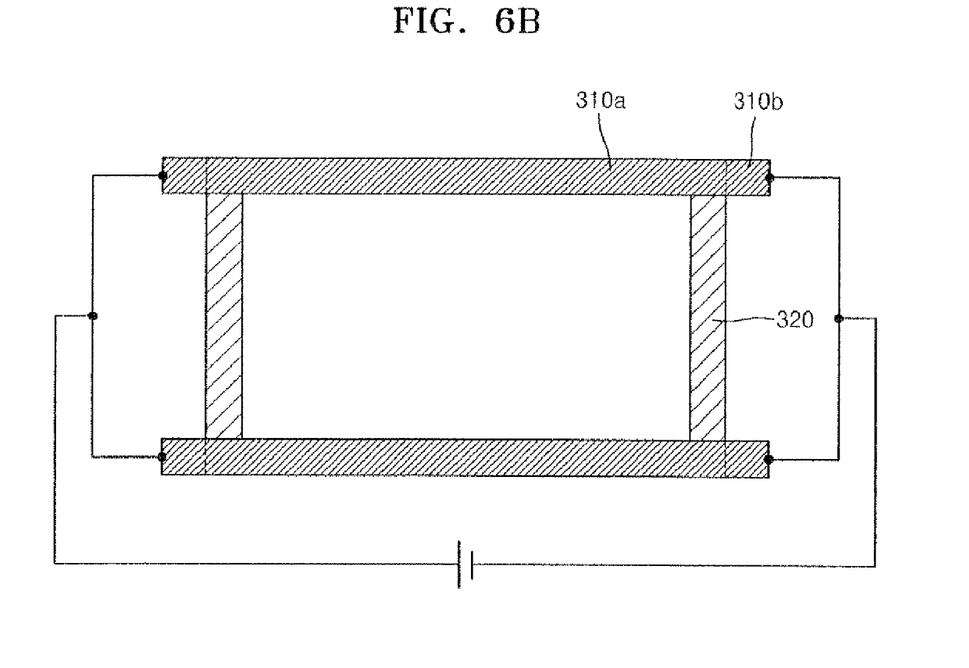

FIGS. 6A and 6B are plan views for explaining the application of an electric field to a conductive layer according to an embodiment of the present invention.

As described above, the sealing substrate 300 according to an embodiment of the present invention includes the first conductive layers 310a, the second conductive layers 320, and the third conductive layers 310b. The first conductive layer 310a and the second conductive layers 320 may define a sealing region by being continuously connected to each other, and the third conductive layers 310b are located on the electric field application regions III, which are outer regions of the sealing regions II, and thus, the third conductive layers 310b are exposed to the outside, although the substrate 200 and the sealing substrate 300 are combined with each other.

Since the process for applying an electric field to conductive layers to melt the glass frit 330 is performed after the substrate 200 and the sealing substrate 300 are combined with each other, the electric field is applied through the third conductive layers 310b. That is, the third conductive layers 310b are formed on the electric field application regions III, which are outer sides of the sealing regions II, so as to melt the glass frit 330 by applying an electric field.

Also, as described above, the first conductive layers 310a and the third conductive layers 310b have a low resistance of a few ohms, and the second conductive layers 320 have a high resistance of a few tens to hundreds of ohms.

In the present invention, the glass frit 330 is melted by applying an electric field two times. FIG. 6A shows the first application of an electric field and FIG. 6B shows the second application of an electric field. However, the electric field application according to the present invention is not limited to two applications.

Referring to FIG. 6A, an electric field is applied in sequence to an upper third conductive layer 310b and a lower third conductive layer 310b on a basis of drawing.

In this case, since the third conductive layers 310b extends from the first conductive layers 310a in a straight line, the upper third conductive layer 310b forms an isopotential relative to the first conductive layer 310a, and the lower third conductive layer 310b also forms an isopotential relative to the first conductive layer 310a.

However, although the upper third conductive layer 310b and the lower third conductive layer 310b respectively form isopotentials relative to the first conductive layer 310a, the upper third conductive layer 310b and the lower third conductive layer 310b respectively have voltages different from each other. Accordingly, voltages applied to both ends of the second conductive layer 320 are also different from each other. As a result, a current flows through the second conductive layer 320, and thus joule heat is generated.

That is, joule heat is generated in the second conductive layer 320 since an electric field is applied in series to the upper third conductive layer 310b and the lower third conductive layer 310b, and thus the glass frit 330 formed on an upper or lower side of the second conductive layer 320 melts. At this point, the first conductive layer 310a is formed so as to have a low resistance of a few ohms and the second conductive layer 320 is formed so as to have a high resistance of a few tens to hundreds of ohms. As a result, the second conductive layer 320 can have a resistance two times or more than that of the first conductive layer 310a. In this case, practically no joule heat is generated in the first conductive layer 310a.

Next, referring to FIG. 6B, an electric field is applied in parallel to the upper third conductive layer 310b and the lower third conductive layer 310b.

In this case, since the third conductive layers 310b extend in a straight line from the first conductive layers 310a, and an electric field is applied in parallel to the upper third conductive layer 310b and the lower third conductive layer 310b, voltages applied to both ends of the upper first conductive layer 310a and the lower first conductive layer 310a are different from each other. As a result, a current flows through the first conductive layer 310a, and thus joule heat is generated.

That is, joule heat is generated in the first conductive layer 310a since an electric field is applied in parallel to the upper third conductive layer 310b and the lower third conductive layer 310b, and thus the glass frit 330 formed on an upper or lower side of the first conductive layer 310a melts. At this point, the first conductive layer 310a is formed so as to have a low resistance of a few ohms and the second conductive layer 320 is formed so as to have a high resistance of a few tens to hundreds of ohms. As a result, the second conductive layer 320 can have a resistance two times or more than that of the first conductive layer 310a. In this case, voltages applied to both ends of the second conductive layer 320 are practically identical to each other, and thus no joule heat is generated in the second conductive layer 320.

The indication of values of low and high resistances of the conductive layers in the present invention is inappropriate since the values of the resistances may vary according to the material and/or thickness of the glass frit 330 and the size of an area to be melted. Accordingly, in the present invention, although it is not intended to define the values of the low and high resistances, the difference between the low and high resistances may be approximately two time or more.

As described above, in the present invention, a sealing substrate is sealed such that an electric field is applied to conductive layers so as to generate a joule heat which melts a glass frit formed on or under conductive layers.

That is, the conventional method of melting a glass frit by irradiating a laser requires a high cost due to the employment of an expensive laser radiation apparatus. However, in the present invention, manufacturing cost can be reduced by adopting the inventive method of applying an electric field to conductive layers.

Also, in the conventional method of melting a glass frit by irradiating a laser, a high precision alignment is required for irradiating the laser. However, according to the present invention, in the method of applying an electric field to the conductive layers, a precision alignment for melting the glass frit is unnecessary because it is only necessary to apply an electric field to a glass frit after forming the glass frit on or under the conductive layers. Also, the time for irradiating an electric field onto the conductive layers is only a few seconds, and thus the process time can be greatly reduced.

While the present invention has been particularly shown and described with reference to exemplary embodiments thereof, it will be understood by one of ordinary skill in the art that various changes in form and detail may be made therein without departing from the spirit and scope of the present invention as defined by the following claims.

What is claimed is:

1. A sealing substrate, comprising a pixel region and sealing regions, the sealing regions comprising conductive layers continuously connected to each other, the conductive layers comprising two opposite first conductive layers formed in a horizontal direction and two opposite second conductive layers formed in a vertical direction, and the first conductive layers having different electrical resistances in comparison with the second conductive layers.

2. The sealing substrate of claim 1, wherein the conductive layers are one of transparent conductive thin films and metal thin films.

3. The sealing substrate of claim 1, wherein the first conductive layers and the second conductive layers have a resistance difference of more than two times relative to each other.

4. The sealing substrate of claim 1, wherein the sealing substrate further comprises electric field application regions formed in outer regions of the sealing regions and third conductive layers formed in the electric field application regions and extending in a straight line from the first conductive layers.

5. The sealing substrate of claim 1, wherein the sealing substrate further comprises electric field application regions formed in outer regions of the sealing regions.

6. The sealing substrate of claim 1, further comprising glass frits formed on the conductive layers.

7. The sealing substrate of claim 6, wherein the glass frit is formed of one selected from the group consisting of PbO, $B_2O_8$, and $SiO_2$.

8. An organic electroluminescence apparatus, comprising:
a substrate having a pixel region and sealing regions;
an organic electroluminescence device located in the pixel region of the substrate; and
a sealing substrate having a pixel region and sealing regions corresponding to the pixel region and the sealing regions of the substrate;
wherein the sealing regions of the sealing substrate comprises conductive layers continuously connected to each other, the conductive layers comprises two opposite first conductive layers formed in a horizontal direction and two opposite second conductive layers formed in a vertical direction, and the first conductive layers have different electrical resistances in comparison with the second conductive layers.

9. The organic electroluminescence apparatus of claim 8, wherein the conductive layers are one of transparent conductive thin films and metal thin films.

10. The organic electroluminescence apparatus of claim 8, wherein the first conductive layers and the second conductive layers have a resistance difference of more than two times relative to each other.

11. The organic electroluminescence apparatus of claim 8, wherein the sealing substrate further comprises electric field application regions formed in outer regions of the sealing regions and third conductive layers formed in the electric field application regions and extending in a straight line from the first conductive layers.

12. The organic electroluminescence apparatus of claim 8, wherein the sealing substrate further comprises electric field application regions formed in outer regions of the sealing regions.

13. The organic electroluminescence apparatus of claim 8, further comprising glass frits formed on the conductive layers.

14. The organic electroluminescence apparatus of claim 13, wherein the glass fit is formed of one selected from the group consisting of PbO, $B_2O_8$, and $SiO_2$.

15. A method of manufacturing an organic electroluminescence apparatus, comprising the steps of:
providing a substrate having a pixel region and sealing regions;
forming an organic electroluminescence device on the pixel region of the substrate;
providing a sealing substrate having a pixel region and sealing regions corresponding to the pixel region and the sealing regions of the substrate; and
combining the substrate and the sealing substrate,
wherein the sealing regions of the sealing substrate comprise conductive layers continuously connected to each other and glass frits formed on the conductive layers, the conductive layers comprise two opposite first conductive layers formed in a horizontal direction and two opposite second conductive layers formed in a vertical direction, and the first conductive layers have different electrical resistances in comparison with the second conductive layers.

16. The method of claim 15, wherein the first conductive layer and the second conductive layers have a resistance difference of more than two times relative to each other.

17. The method of claim 15, wherein the sealing substrate further comprises electric field application regions formed in outer regions of the sealing regions and third conductive layers formed in the electric field application regions and extending in a straight line from the first conductive layers.

18. The method of claim 17, further comprising the step of sealing by bonding the sealing substrate to the substrate after combining the sealing substrate to the substrate, and the step of sealing by bonding the sealing substrate to the substrate comprises melting the glass frits by applying an electric field onto the third conductive layers.

19. The method of claim 18, wherein the third conductive layers are exposed to the outside.

20. The method of claim 18, wherein the third conductive layers comprise an upper third conductive layer and a lower third conductive layer, and an electric field is applied in sequence to the upper third conductive layer and the lower third conductive layer.

21. The method of claim 18, wherein the third conductive layers comprise an upper third conductive layer and a lower third conductive layer, and an electric field is applied in parallel to the upper third conductive layer and the lower third conductive layer.

22. The method of claim 15, wherein the sealing substrate further comprises electric field application regions formed in outer regions of the sealing regions.

23. The method of claim 15, further comprising the step of sealing by bonding the sealing substrate to the substrate after the sealing substrate and the substrate are combined with each other, wherein the step of sealing by bonding the sealing substrate to the substrate comprises melting the glass frits by applying an electric field onto the conductive layers.

24. The method of claim 23, wherein the applying of the electric field is performed with a power density in a range of approximately 100 to 1,000,000 W/cm$^2$.

25. The method of claim 23, wherein the applying of the electric field is performed for a time in a range of 1/1,000,000~10 seconds.

* * * * *